United States Patent
Thorum

(10) Patent No.: US 6,739,042 B2
(45) Date of Patent: May 25, 2004

(54) METHOD FOR ASSEMBLING A MECHATRONICS SENSOR

(75) Inventor: Michael D. Thorum, Lake Orion, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 139 days.

(21) Appl. No.: 09/935,953

(22) Filed: Aug. 23, 2001

(65) Prior Publication Data

US 2002/0073538 A1 Jun. 20, 2002

Related U.S. Application Data

(60) Provisional application No. 60/255,941, filed on Dec. 15, 2000, provisional application No. 60/255,942, filed on Dec. 15, 2000, provisional application No. 60/255,943, filed on Dec. 15, 2000, provisional application No. 60/255,944, filed on Dec. 15, 2000, and provisional application No. 60/255,945, filed on Dec. 15, 2000.

(51) Int. Cl.$^7$ ................................................. H05K 3/30
(52) U.S. Cl. ............................ 29/832; 29/830; 29/835; 29/843; 29/593; 257/668
(58) Field of Search .......................... 29/832, 834, 835, 29/829, 830, 593, 846, 843, 840, 842; 257/668, 723; 74/606 R; 73/756

(56) References Cited

U.S. PATENT DOCUMENTS

| | | | |
|---|---|---|---|
| RE30,604 E | * 5/1981 | Kowalski | 357/70 |
| 4,554,505 A | * 11/1985 | Zachry | 324/158 |
| 4,744,009 A | * 5/1988 | Grabbe et al. | 361/389 |
| 5,219,377 A | * 6/1993 | Poradish | 29/830 |
| 5,224,387 A | 7/1993 | Lindenbaum et al. | |
| 5,305,663 A | 4/1994 | Leonard et al. | |
| 5,606,198 A | * 2/1997 | Ono et al. | 257/666 |
| 5,685,803 A | 11/1997 | Furukawa et al. | |
| 5,733,598 A | 3/1998 | Sera et al. | |
| 5,847,282 A | 12/1998 | Keller | |
| 6,049,975 A | * 4/2000 | Clayton | 29/832 |
| 6,086,509 A | 7/2000 | Johnson et al. | |
| 6,155,119 A | 12/2000 | Normann et al. | |
| 6,171,207 B1 | 1/2001 | Ehrlich et al. | |
| 6,209,399 B1 | 4/2001 | Probst et al. | |
| 6,612,202 B2 | * 9/2003 | Thorum et al. | 74/606 R |
| 2002/0073538 A1 | * 6/2002 | Thorum | 29/832 |

FOREIGN PATENT DOCUMENTS

| | | | |
|---|---|---|---|
| DE | 19607179 | | 7/1997 |
| EP | 0892592 | | 1/1999 |
| FR | 2717957 | * | 2/1994 |
| GB | 685912 A | | 1/1953 |
| JP | 2000-243077 | * | 9/2000 |

OTHER PUBLICATIONS

Search report, dated Nov. 27, 2002.

* cited by examiner

Primary Examiner—Carl J. Arbes
Assistant Examiner—Minh Trinh

(57) ABSTRACT

A method of mounting a mechatronics control module (14) includes an electronic control unit (16) having a flex foil circuit (34) with a multiple of mounted electronic components including sensors (24) which sense the hydraulic state of the transmission clutch or other frictional engagement elements within the transmission system. The sensor is mounted to a base plate (82) which is mounted to a fixture (88) which folds the flap (84.) When the base plate (82) and mounted sensor are removed from the fixture (88), the flap (84) unfolds so that the circuit traces of the flex foil (34) are adjacent the contacts (94.) In a final step, the circuit traces (81) are electrically connected to the contacts (94.)

11 Claims, 11 Drawing Sheets

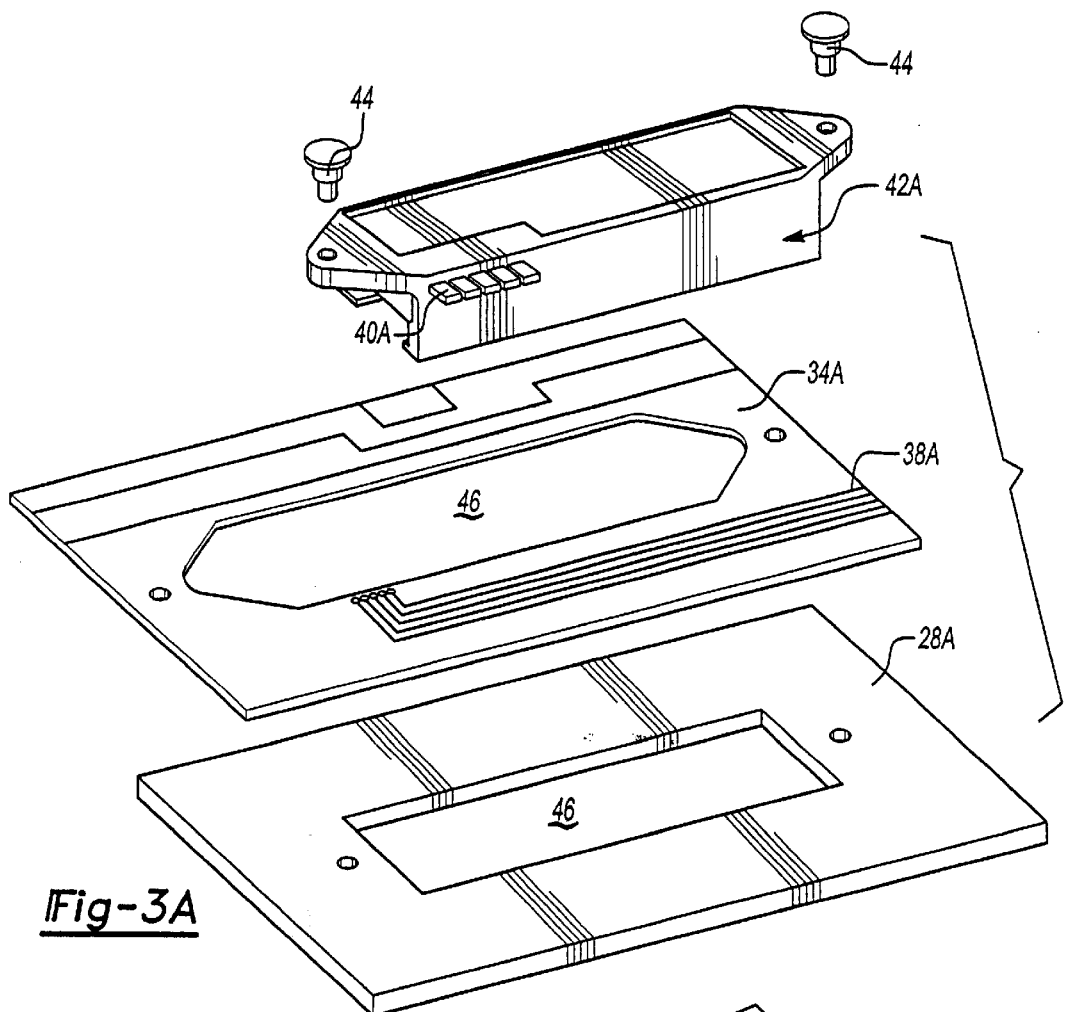
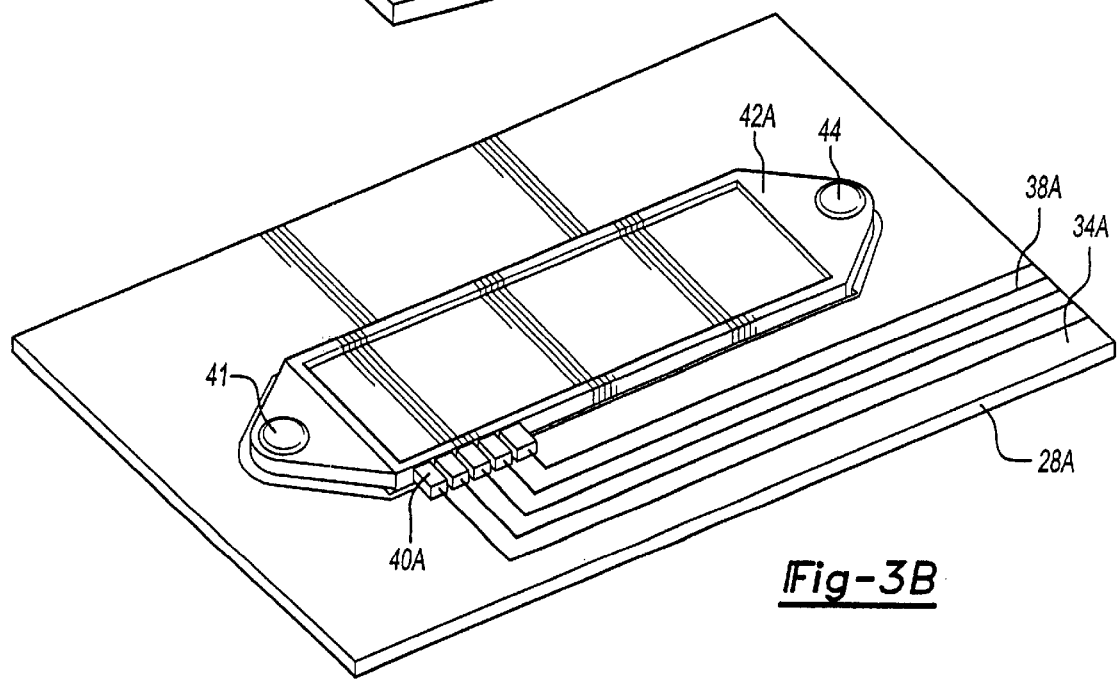

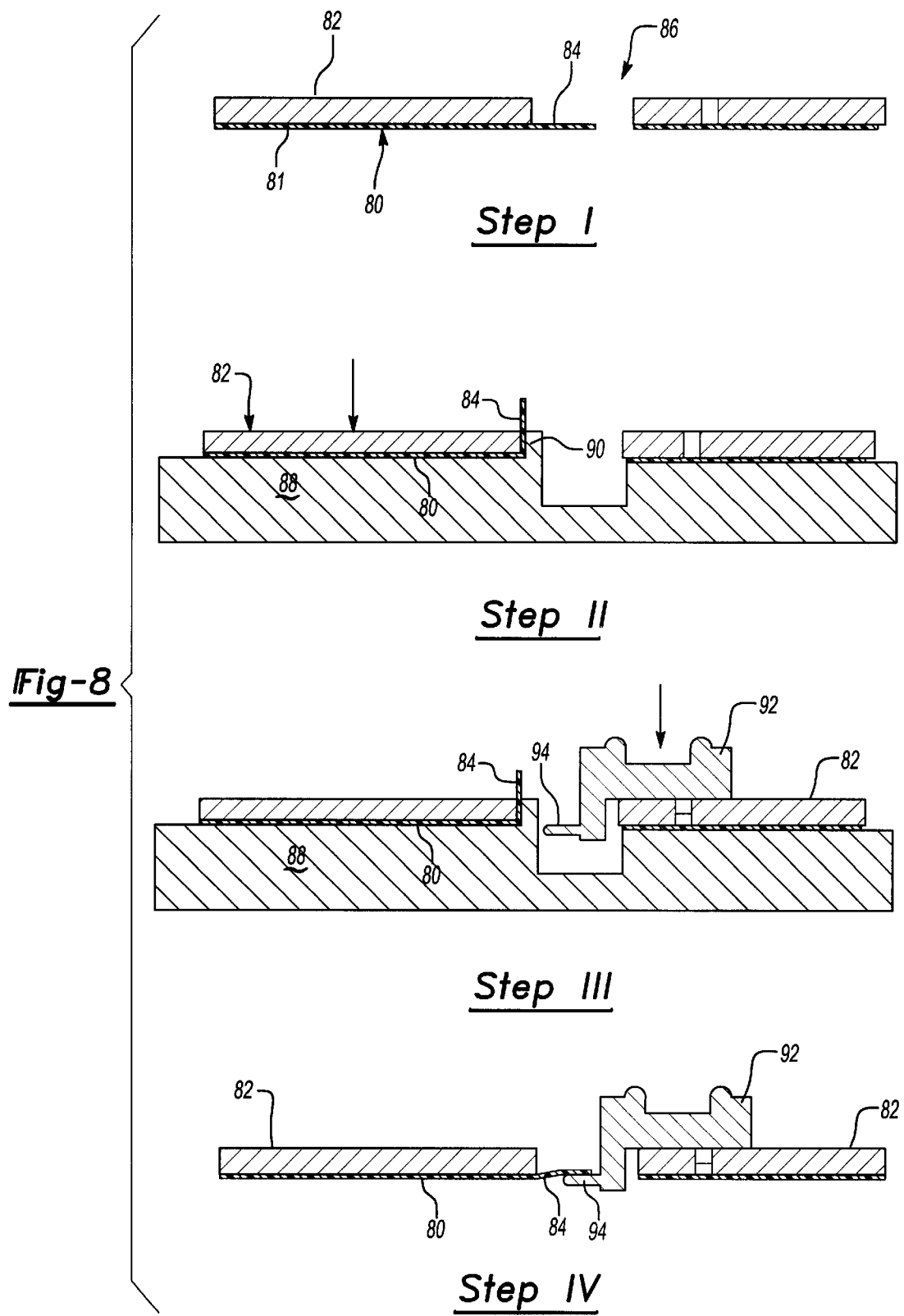

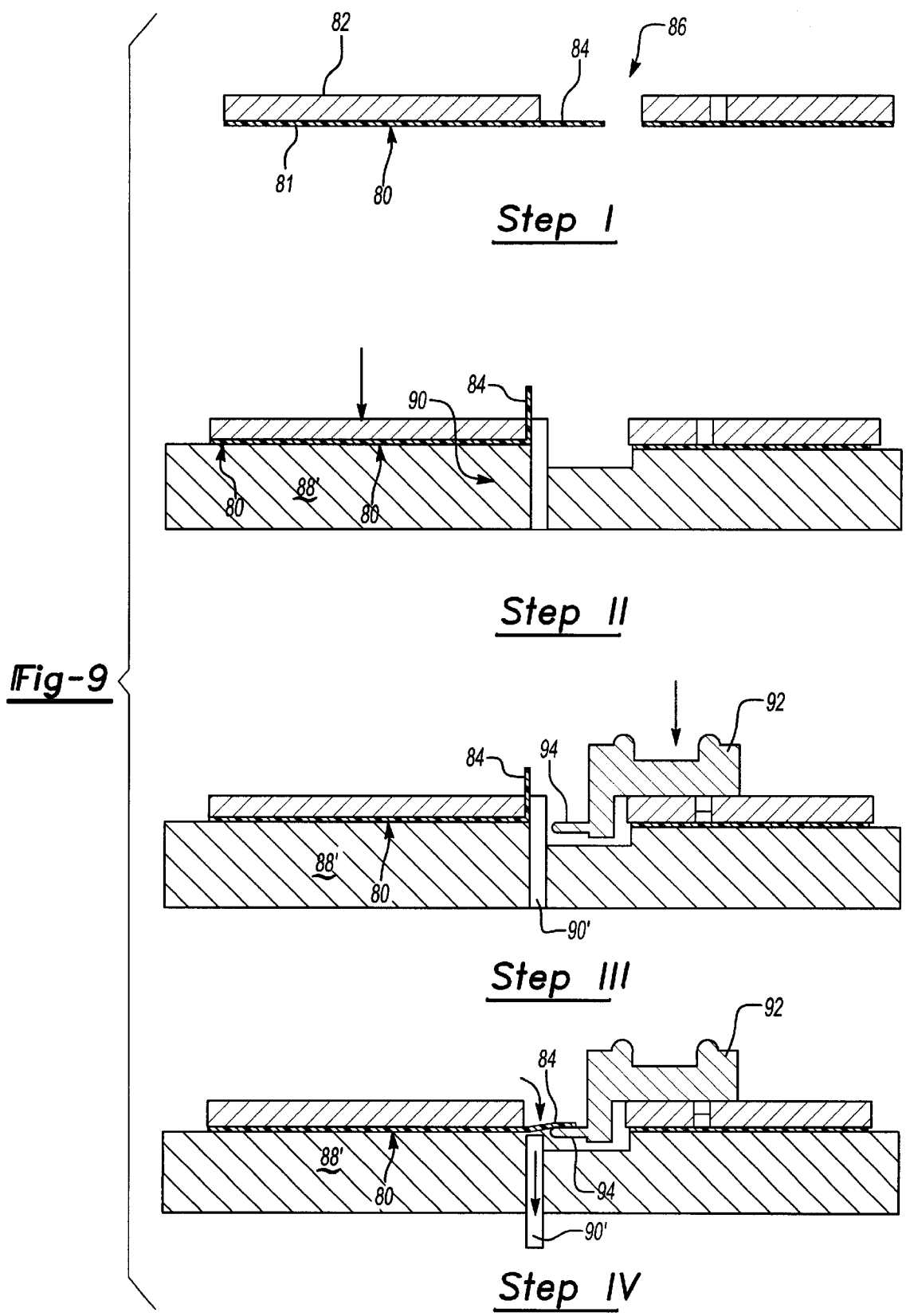

US 6,739,042 B2

METHOD FOR ASSEMBLING A MECHATRONICS SENSOR

The present application claims priority to U.S. Provisional Patent Application Ser. Nos. 60/255,941, filed Dec. 15, 2000; 60/255,942, filed Dec. 15, 2000; 60/255,943, filed Dec. 15, 2000; 60/255,944, filed Dec. 15, 2000; and 60/255,945, filed Dec. 15, 2000.

BACKGROUND OF THE INVENTION

The present invention relates to an attachment arrangement, and more particularly to an attachment arrangement for components mounting within a vehicle transmission.

A hydraulically operated vehicle transmission is typically equipped with multiple frictional engaging elements such as hydraulic clutches, disks, brakes and the like that are engaged and disengaged by supplying/discharging operating oil to/from the frictional engaging elements. Proper operation and timing of the shift is achieved by optimizing the oil pressure for engagement/disengagement. The detection of the state of the clutch or other such frictional engagement elements is typically achieved by detecting the engaging oil pressure through an oil pressure sensor. The oil pressure sensor communicates with a transmission electronic control unit which commands the gear shit timing.

Ordinarily, the sensor is located within the transmission case which subjects the sensor to an extremely difficult environment. As a result, these components must be connected in a manner which is robust and impervious to the environment within the transmission case. Typically, multiple wire harnesses connect individual sensors to a connector extending through the transmission case. An external wire harness then provides communication between the sensors and the transmission electronic control unit. Only the sensors and their wire connections are located within the transmission case to avoid subjecting the electronic control unit to the difficult environment within the transmission case. Disadvantageously, the wire connections must routed within the transmission case to avoid multiple moving transmission components. In addition to the weight penalty of multiple wire harnesses, the routing may become rather complex and multiple wire connections may increase the possibility of failure.

Accordingly, it is desirable to provide a compact mounting arrangement for sensors and associated components which are resistant to the environment within a transmission case while minimizing wire connections and providing advantageous assembly versatility.

SUMMARY OF THE INVENTION

The transmission system according to the present invention provides a transmission housing having a mechatronics control module mounted therein. The mechatronics control module includes an electronic control unit having a flex foil circuit for the mounting of multiple electronic components including sensors which sense the hydraulic state of elements within the transmission system.

One embodiment of a method for mounting the sensor includes laminating the flex foil to a base plate such that the circuit traces are located opposite the base plate. A flex foil flap which was previously cut into the flex foil is aligned adjacent to an opening in the base plate.

A fixture having an extension is aligned with the opening and folds the flap such that flap is pushed substantially perpendicular to the opening. The sensor is mounted to the base plate such that the contacts which extends from the sensor, clears the folded flap and are received within a recess in the fixture. The base plate and mounted sensor are removed from the fixture and the flap unfolds so that the circuit traces of the flex foil are now adjacent the contacts. In a final step, the circuit traces are electrically connected to the contacts by laser welding or the like.

The present invention therefore provides a compact mounting arrangement for sensors and associated components which are resistant to the environment within a transmission case, minimize wire connections, and provide extensive assembly versatility.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows:

FIG. 3A is a general exploded view of one sensor attachment arrangement according to the present invention;

FIG. 3B is a general top perspective view of the sensor attachment arrangement illustrated in FIG. 3A;

FIG. 8 is a schematic representation of one sensor mounting method according to the present invention; and FIG. 9 is a schematic representation of another sensor mounting method according to the present invention.

DETAILED DESCRIPTION OF THE PREFERRED EMBODIMENT

Figure 1:
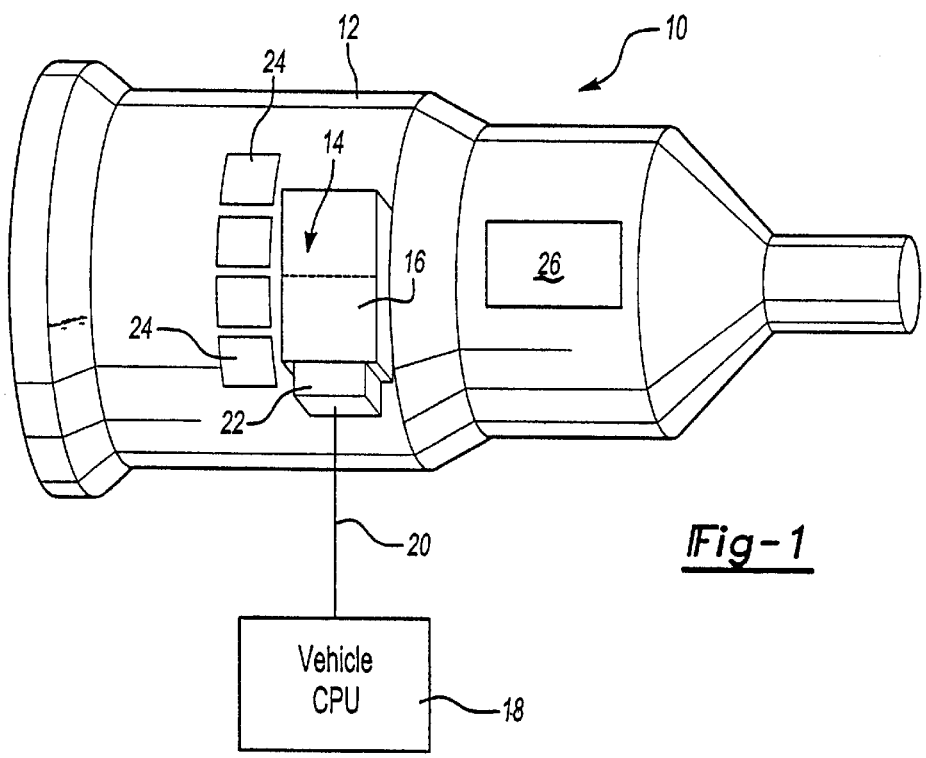
FIG. 1 is a general perspective view of a transmission system for use with the present invention.

FIG. 1 schematically illustrates a vehicle transmission system 10. The transmission system 10 includes a transmission housing 12 having a mechatronics control module 14 mounted therein. The control module 14 includes an electronic control unit 16 communicating to a vehicle controller 18 through a wire harness 20. The electronic control unit 16 preferably include a flex foil circuit with a multiple of surface mounted electronic components as will be further described below. The wire harness 20 is connected to the control unit 16 through a connector 22 that is mounted through the housing 12. Sensors 24 communicate with the control unit 16 to provide the hydraulic state of the transmission clutch or other frictional engagement elements (illustrated schematically at 26) within the transmission system 10.

Figure 2:
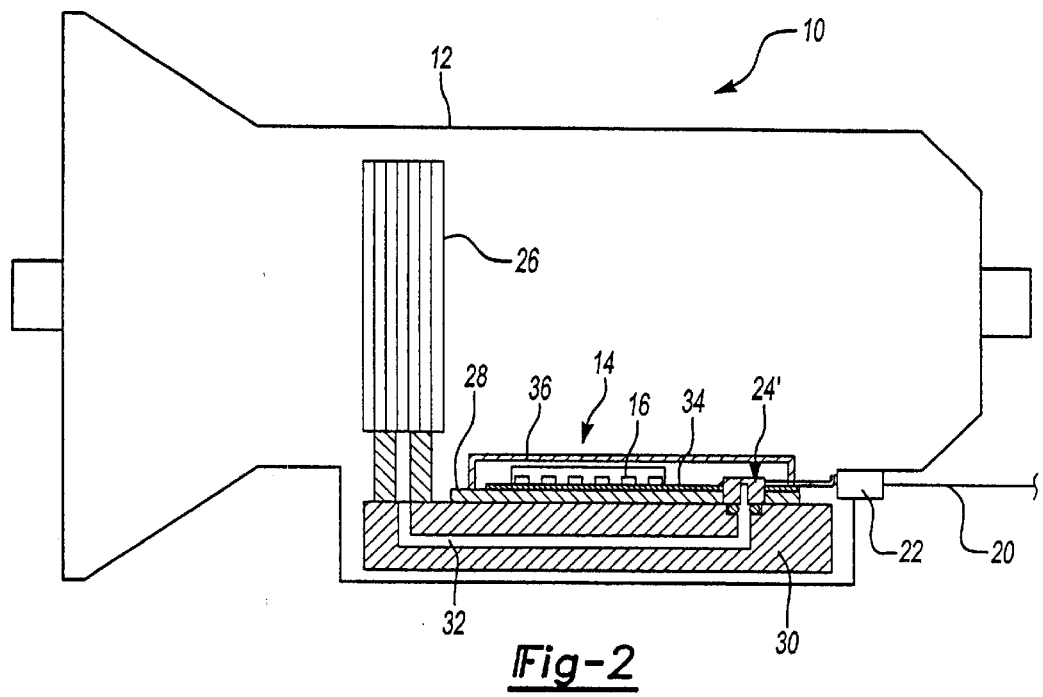
FIG. 2 is a sectional schematic view of a vehicle transmission housing including a sensor attachment arrangement according to the present invention.

Referring to FIG. 2, the electronic control unit 16 is preferably mounted to a base plate 28 which covers at least a portion of a hydraulic control unit 30 having a plurality of hydraulic channels 32 (only one illustrated.) The electronic control unit 16 preferably communicates with the sensor 24' and other electrical components through a flexible circuit or flex foil 34. The flex foil 34 is essentially a flexible circuit board which provides electronic communication between electronic components through a multiple of circuit traces (FIG. 3A.) The flex foil 34 may be one sided flex foil or two sided flex foil—that is, the flex foil includes circuit traces accessible from either one or both sides.

A control module housing 36 is mounted to the plate 28 to seal the electronic control unit 16 from the environmental conditions within the transmission housing 12. The flex foil 34, being flat and thin, is passed between the housing 36 and the base plate 28 to interconnect other electronic components such as the connector 22 that are located outside the housing 36. Other routes and seals will also benefit from the flex foil 34 structure which provides improved sealing characteristics in comparison to a round wire.

The hydraulic control unit 30 is preferably a valve assembly which receives fluid communicating with the frictional elements 26 through the hydraulic channels 32. As is generally known, through the operation of various valves and ports within the hydraulic channels 32, the hydraulic control unit 30 provides the working pressure to operate the friction elements and automatic controls to shift the transmission system 10.

The pressure of the fluid within the channel 32 is measured by sensors 24 (FIG. 1) such as a pressure sensor 24' which communicates with the electronic control unit 16. The electronic control unit 16, through preprogrammed logic and in receipt of other data from communication with the vehicle controller 18 (FIG. 1), assures that the transmission system 10 is properly shifted in response to vehicle speed. It should be understood that although only one sensor 24', one friction element and associated channel 32 are illustrated in the disclosed embodiment, other and/or additional sensors, channels, and frictional elements which communicate with the electronic control unit 16 will also benefit from the present invention.

Referring to FIG. 3A, one embodiment of a sensor mounting arrangement is illustrated. The flex foil 34a is preferably bonded to the base plate 28a such that a laminate structure is formed. The base plate 28a is layered with the flex foil such that a plurality of circuit traces 38a on the flex foil 34a are located opposite the base plate 28a. It should be understood that when reference is made to the circuit trace side of the flex foil, the circuit trace side is that side which provides contacts or access to the circuit traces for components that are mounted thereto as the circuit traces may be laminated within multiple layers of the flex foil for protection thereof. The circuit traces 38a are electrically located to communicate with a multiple of respective contacts 40a extending from the position sensor 42a through soldering, laser welding, riveting spring-loaded contacts or the like. Attachment members such as rivets 44 mount the sensor 42a in an opening 46 in the base plate 28a and sandwich the flex foil there between (FIG. 3B.) It should be understood that other attachment members such as snaps, threaded fasteners, pins or the like will also benefit from the instant invention.

Figure 3C:
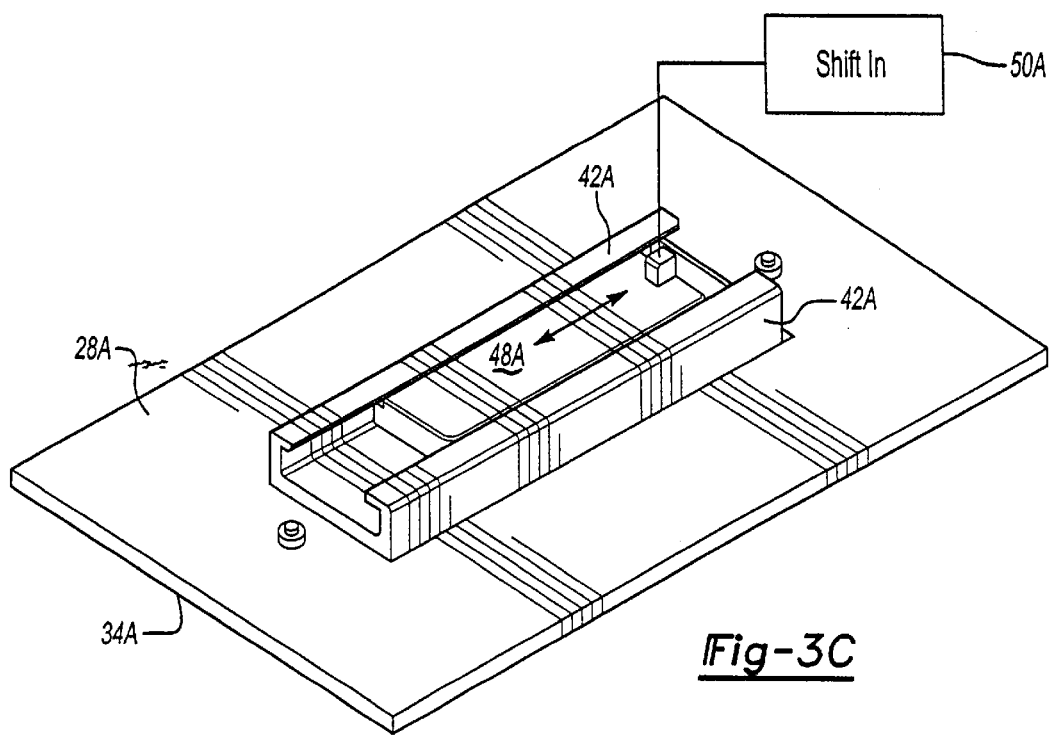
FIG. 3C is a general bottom perspective view of the sensor attachment arrangement illustrated in FIG. 3A.

Referring to FIG. 3C, an opposite side (non-flex foil 34a side) of the base plate 28a is illustrated. The position sensor 42a extends at least partially through the base plate 28a such that a movable portion 48a of the sensor 42a is accessible. The movable portion 48a is connected to movable member such as for example only, a shift input (illustrated schematically at 50a) to sense the position thereof and communicate the sensed position to the electronic control unit 16 (FIG. 2).

Figure 4A:
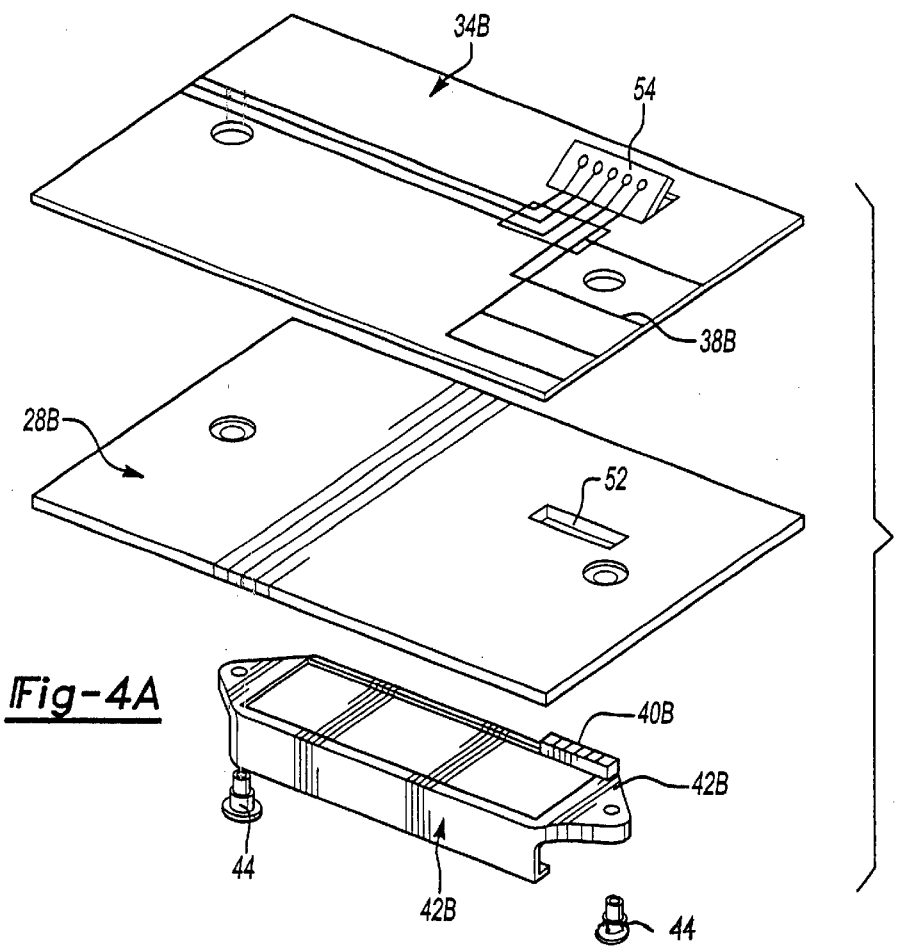
FIG. 4A is a general exploded view of another sensor attachment arrangement according to the present invention.

Referring to FIG. 4A, another embodiment of a sensor mounting arrangement is illustrated. The flex foil 34b is preferably bonded to the base plate 28b such that a laminate structure is formed. That is, the base plate 28b is layered with the flex foil such that a plurality of circuit traces 38b on the flex foil 34b are located opposite the base plate 28b. Attachment members such as rivets 44 mount a position sensor 42b to the base plate 28b on the side opposite the flex foil 34b.

A contact opening 52 within the base plate 28b and flex foil 34b expose to the non-flex foil side of the base plate 28b contacts 40b extending from the position sensor 42b. That is, the sensor 42b is mounted such that the contacts 40b face the non-circuit trace side of the flex foil 34b. To allow communication between the circuit traces 38b and the contacts 40b, a flex foil flap 54 is formed in the flex foil 34b adjacent the contact opening 52.

Figure 4B:
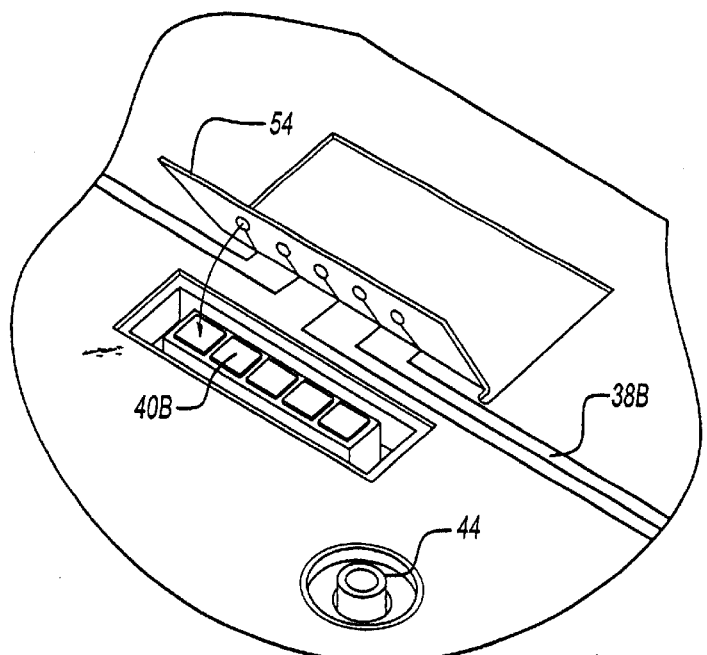
FIG. 4B is an expanded view of a flex foil flap of the sensor attachment arrangement illustrated in FIG. 4A.
Figure 4C:
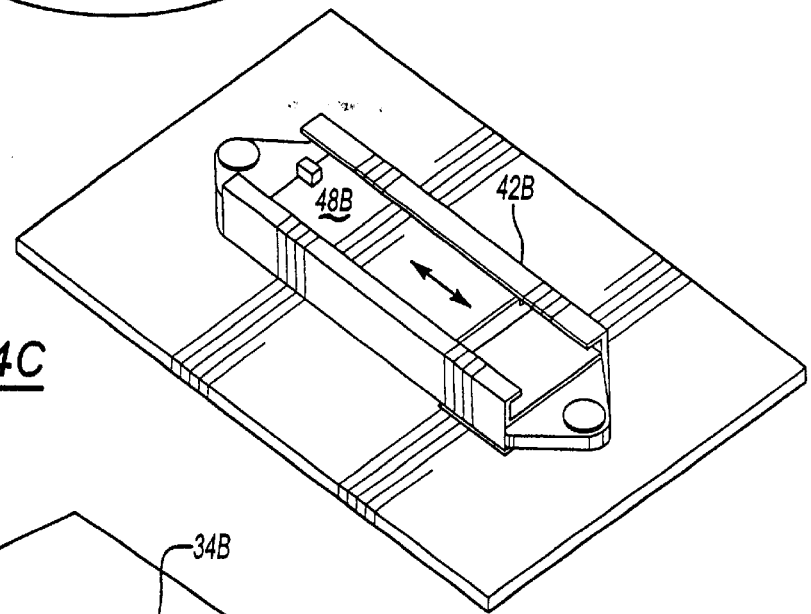
FIG. 4C is a general bottom perspective view of the sensor attachment arrangement illustrated in FIG. 4A.
Figure 4D:
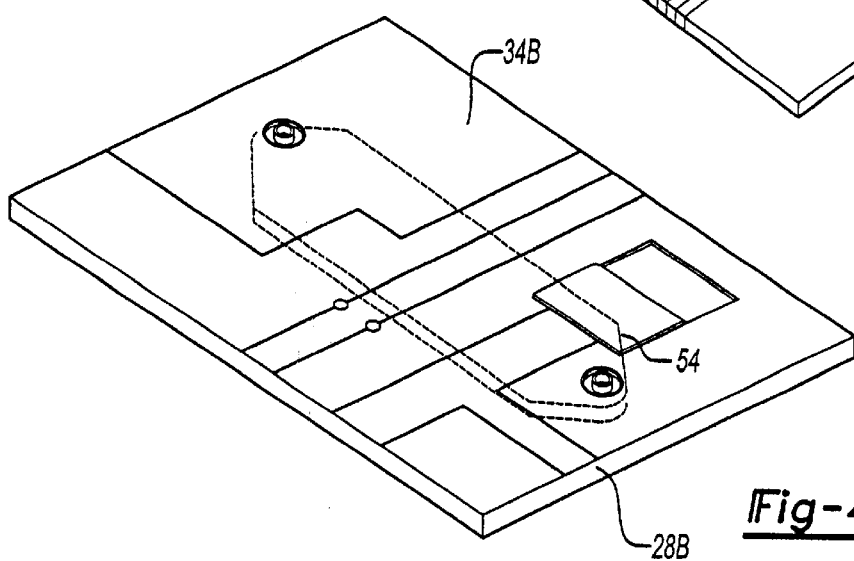
FIG. 4D is a general top perspective view of the sensor attachment arrangement illustrated in FIG. 4A.

With reference to FIG. 4B, the flap 54 is folded over so that the circuit traces 38b are electrically attachable with the circuit traces 38b through soldering, laser welding or the like. The position sensor 42b is mounted to the base plate 28b on the side opposite the flex foil 34b to expose a movable portion 48b of the sensor 42b (FIG. 4C.) Moreover, the circuit trace side of the flex foil 34b is still available to provide mounting area for additional electrical components directly opposite the sensor 42b (FIG. 4D.) An extremely compact arrangement is thereby provided.

Figure 5A:
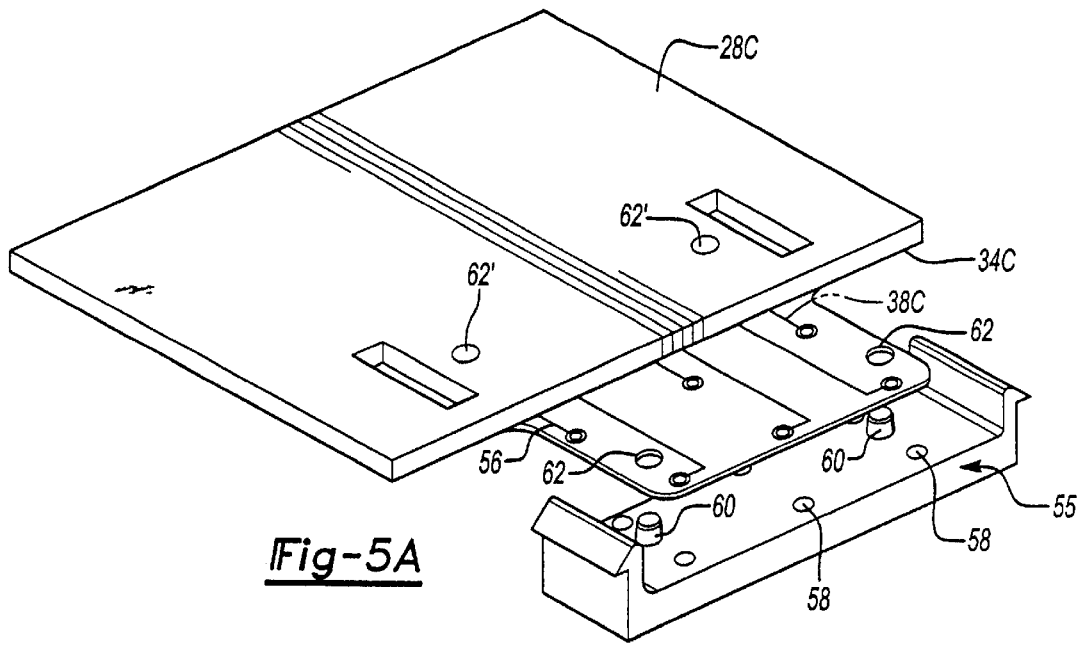
FIG. 5A is a general exploded view of another sensor attachment arrangement according to the present invention.

Referring to FIG. 5A, another embodiment of a sensor mounting arrangement is illustrated. The flex foil 34c is preferably bonded to the base plate 28c such that a laminate structure is formed. In this embodiment, an extended flex foil portion 56 extends beyond the periphery of the base plate 28c. That is, the base plate 28c is layered with the flex foil 34c such that a plurality of circuit traces 38c on the flex foil 34c are located opposite the base plate 28c.

A sensor 55 include a multiple of contacts 58 which are electrically connected to the circuit traces 38c through soldering, laser welding or the like. It should be understood that the contacts may include contacts of any size or shape. Preferably, one or more locators 60 extend from the sensor 55 on the same plane as the contacts 58 to be received into corresponding alignment openings 62 in the flex foil apertures to assure proper alignment and contact between the contacts 58 and circuit traces 38c.

Figure 5B:
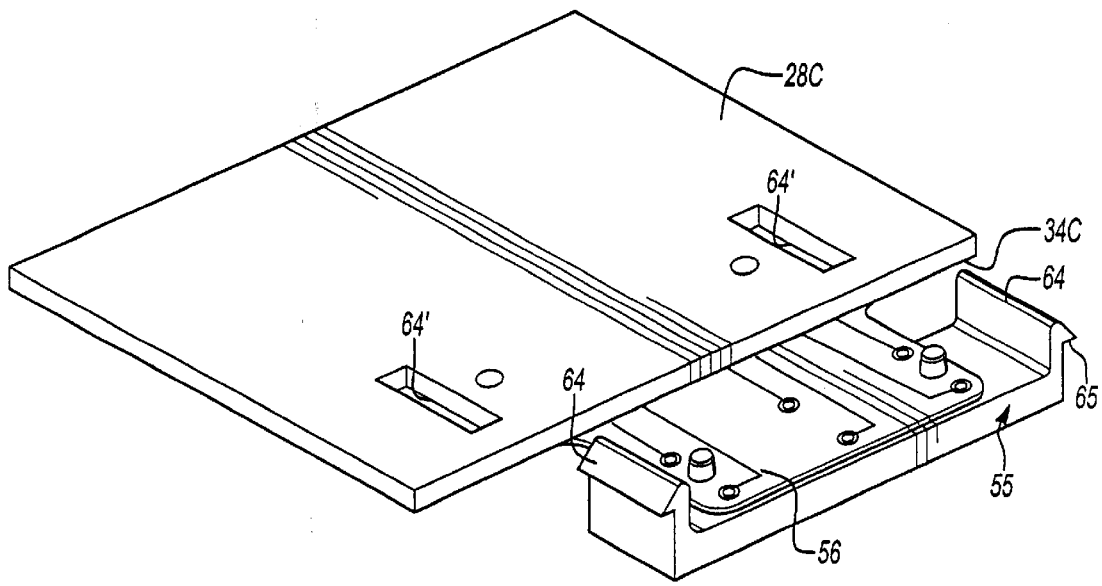
FIG. 5B is an expanded view of an extended flex foil portion attached to the sensor illustrated in FIG. 5A.
Figure 5C:
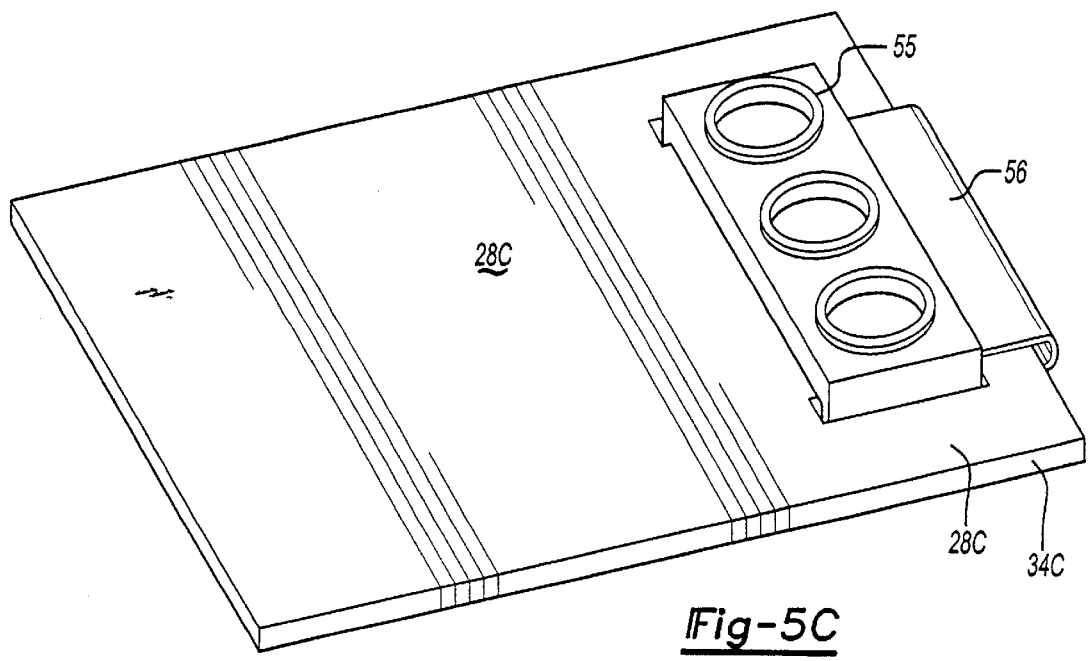
FIG. 5C is a general top perspective view of the sensor attachment arrangement illustrated in FIG. 5A.
Figure 5D:
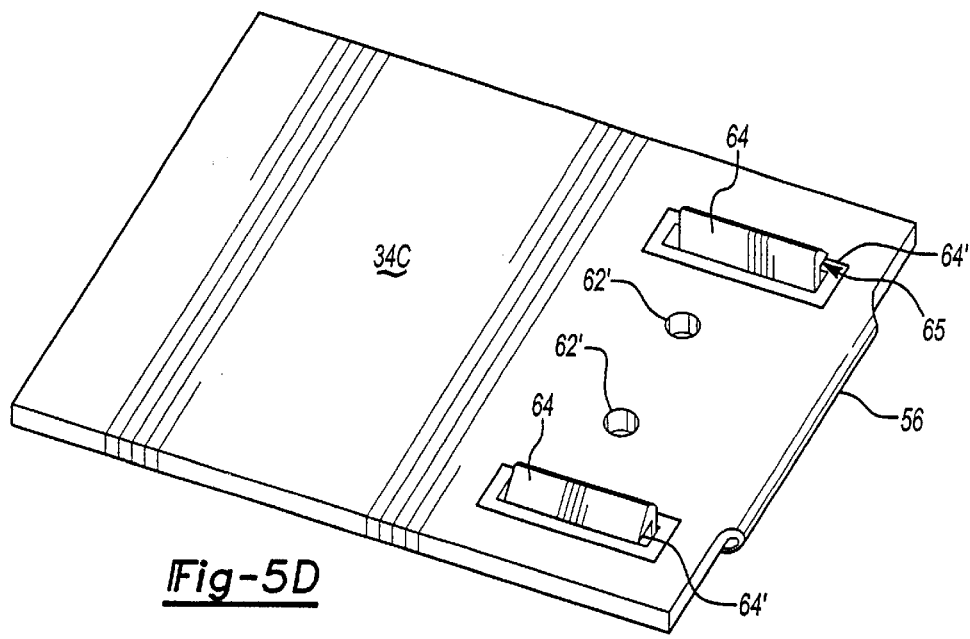
FIG. 5D is a general bottom perspective view of the sensor attachment arrangement illustrated in FIG. 5A.

Referring to FIG. 5B, the sensor 55 is illustrated attached to the extended flex foil portion 56. Resilient retaining snaps 64 preferably extend from the sensor 56. The extended flex foil portion 56 with the attached sensor 55 is folded over an edge (in the direction of arrow F) of the base plate 28c. The retaining snaps 64 are inserted into corresponding base plate slots 64' to thereby lock the sensor 56 onto the base plate (FIG. 5C.) The retaining snaps 64 preferably provide a locking surface 65 which engage the opposite side (Flex foil 34c side) of the base plate 28c (FIG. 5D). The sensor 56 is thereby mounted to the base plate 28c on the side opposite the flex foil 34c and the circuit trace side of the flex foil 34c is again available to provide mounting area for additional electrical components.

Figure 6A:
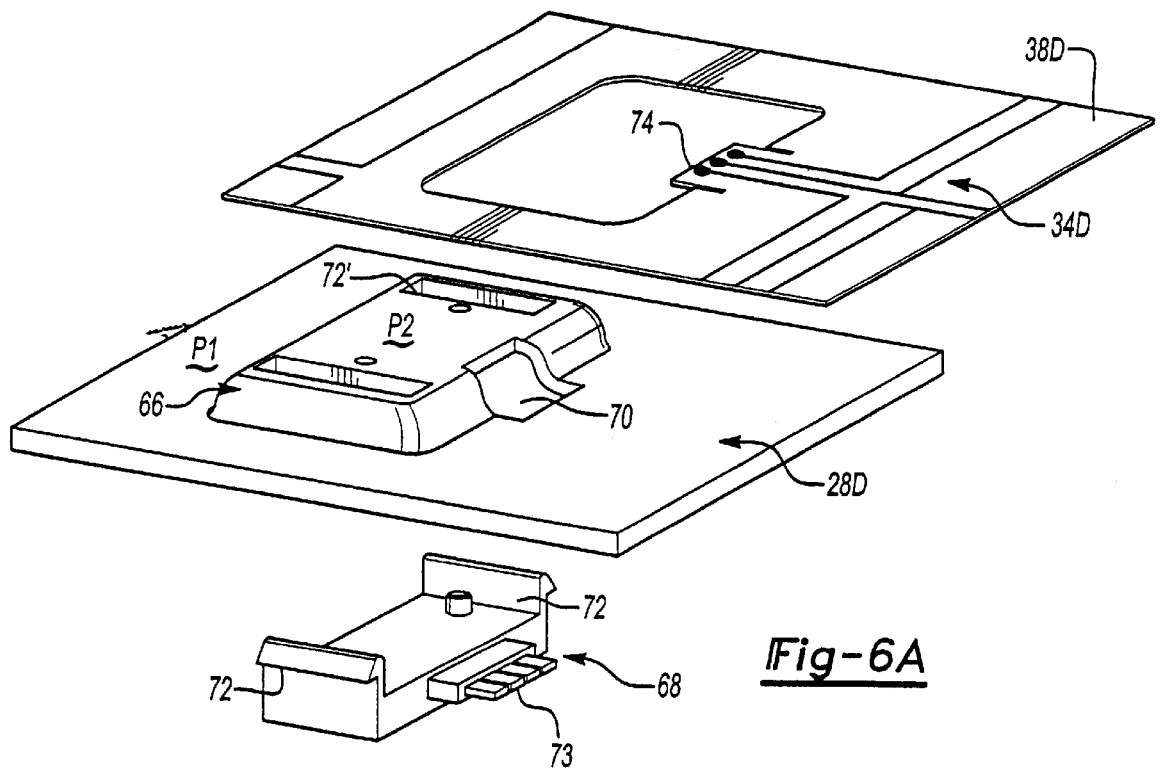
FIG. 6A is a general exploded view of another sensor attachment arrangement according to the present invention.

Referring to FIG. 6A, yet another embodiment of a sensor mounting arrangement is illustrated. The flex foil 34d is preferably bonded to a base plate 28d such that a laminate structure is formed. The base plate 28d is layered with the flex foil such that a plurality of circuit traces 38d on the flex foil 34d are located opposite the base plate 28d.

Figure 6B:
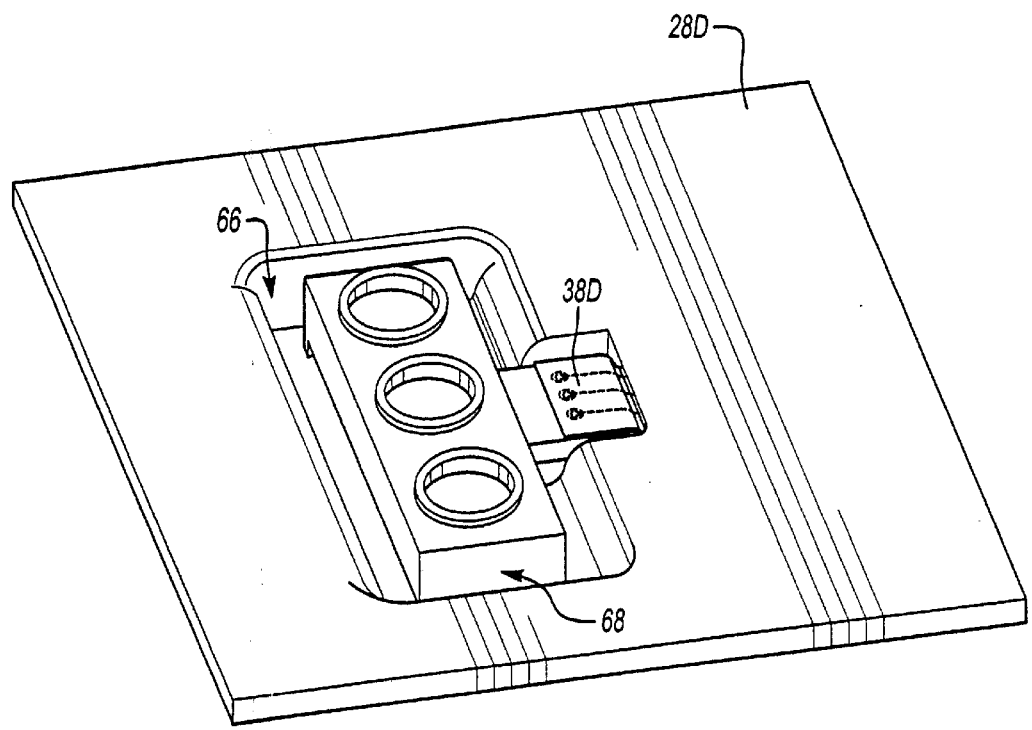
FIG. 6B is a general bottom perspective view of the sensor attachment arrangement illustrated in FIG. 6A.

The base plate 28d preferably includes a recessed area 66 for receipt of a sensor 68. The recessed area 66 defines a second plane P2 offset from a first plane P1 defined by the base plate 28d. The recessed area 66 is preferably convex toward the laminated flex foil 34d side and is deep enough to receive the height of the sensor 68 (FIG. 6B.) A contact opening 70 in the base plate 28d is located to allow receipt of contacts 73 extending from the sensor 68 on one side and a flex foil flap 74 from the opposite side. Preferably, the contact opening 70 is located from the first plane P1 to the second plane P2. The flex foil flap 74 extends into the contact opening 70 in a cantilever manner (FIG. 6C) when the flex foil 34d is laminated to the base plate 28d.

Figure 6C:
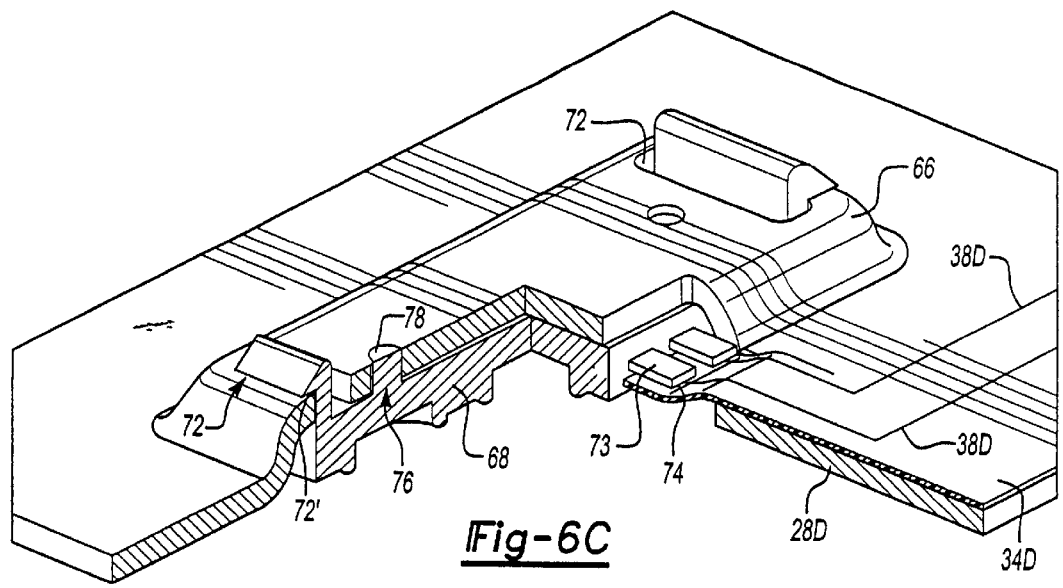
FIG. 6C is a partial sectional view of the sensor attachment arrangement illustrated in FIG. 6A.

Referring to FIG. 6C, a partial sectional view of the installed sensor 68 is illustrated. As described above, retaining snaps 72 are inserted into corresponding base plate slots 72' to thereby lock the sensor 68 into the recessed area 66. Additionally, one or more locators 76 extend from the sensor 68 to be received into corresponding alignment openings 78 in the base plate 28d.

As the sensor 68 is mounted into the recessed area 66, the contacts 73 are aligned with the contact opening 70 and are pushed past the flex foil flap 74 to emerge on the opposite side thereof. That is, the contacts 73 are passed to the circuit trace 38d side of the flex foil 34d such that the contacts 73 extending from the sensor 68 are attachable thereto through soldering, laser welding or the like. The flap 74 facilitates this passage. The sensor 68 is thereby mounted to the recessed area 66 on the side opposite the flex foil 34d and recessed into the base plate 28d. The recessed mounting provides many base plate 28d attachment advantages including improving the seal between the base plate and the hydraulic control unit (FIG. 2) to further minimize the possibility of leakage there between.

Figure 7A:
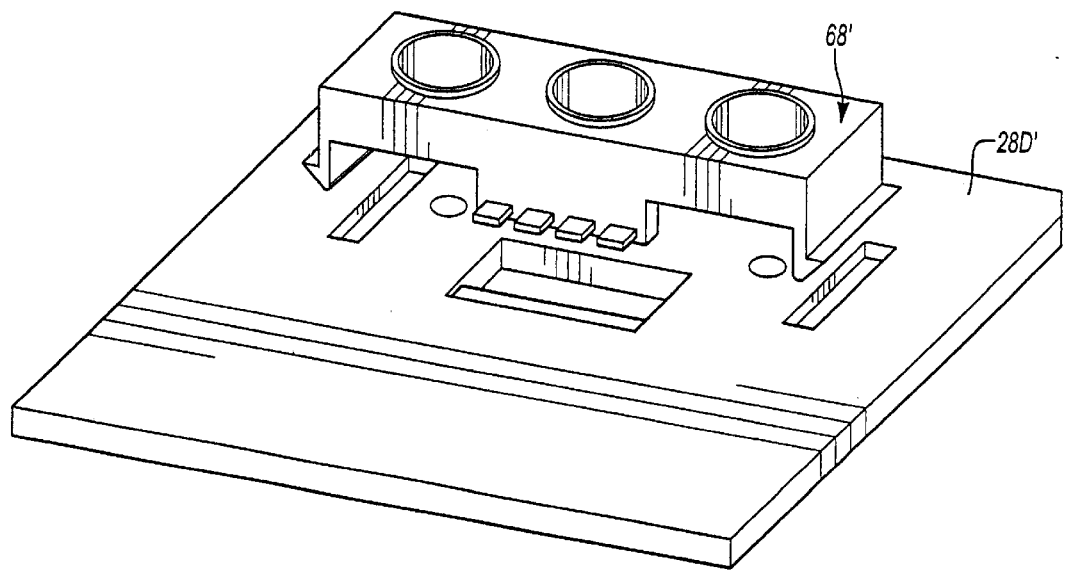
FIG. 7A is a general exploded view of another sensor attachment arrangement according to the present invention.
Figure 7B:
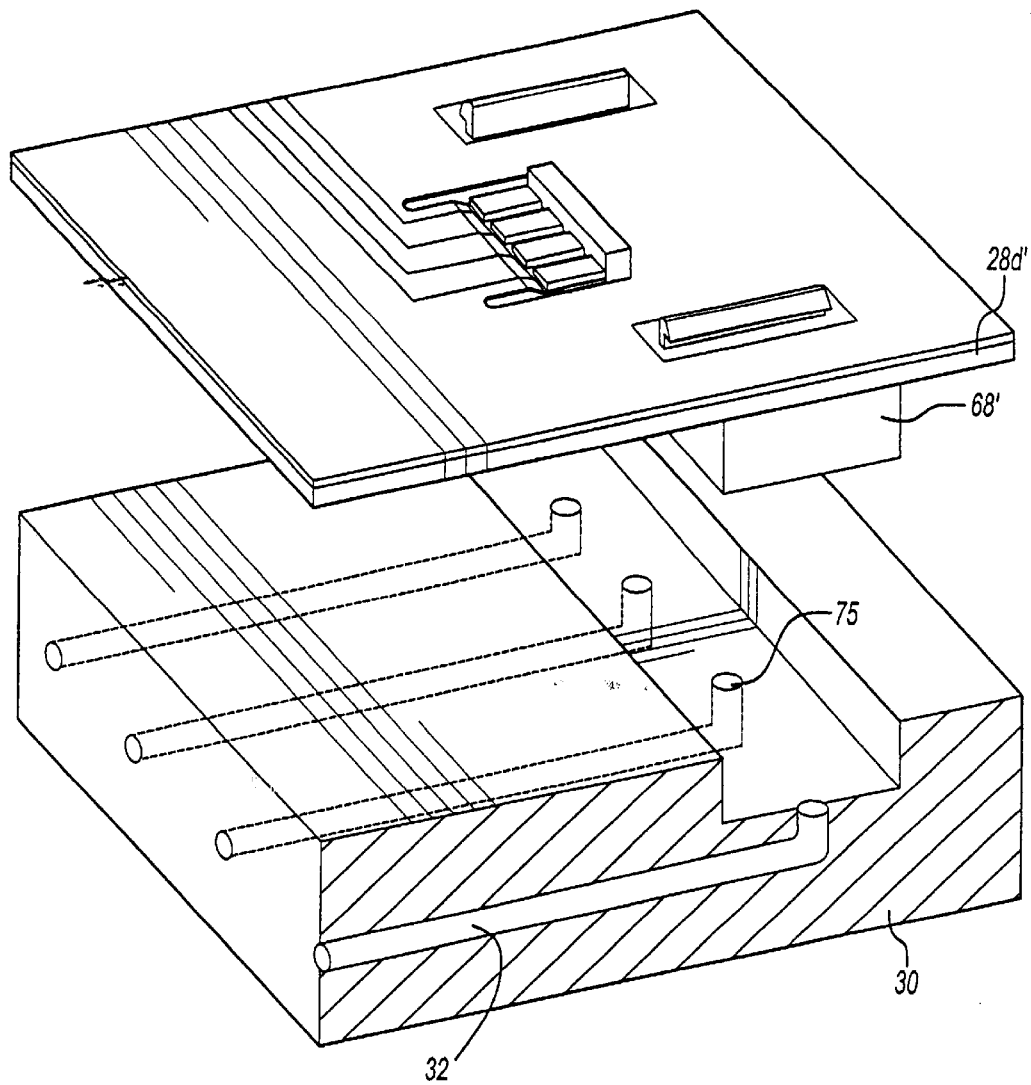
FIG. 7B is a general exploded view of the sensor attachment arrangement illustrated in FIG. 7A adjacent to a hydraulic control unit illustrated in FIG. 2.

Referring to FIG. 7A, another embodiment of a sensor mounting arrangement is illustrated. The mounting arrangement illustrated in FIG. 7A is similar to that disclosed in FIGS. 6A–6C, however, the sensor 68' is mounted to substantially flat base plate 28d'. As illustrated in FIGS. 7B, this mounting arrangement provides for an advantageous seal between the between the base plate and the hydraulic control unit which locates the sensor 68' directly adjacent pressure ports 75 in the hydraulic control unit 30 (also shown in FIG. 2). Accurate readings and an effective seal are thereby advantageously provided.

Referring to FIG. 8 a method for mounting the sensor as disclosed in FIGS. 6A–7B is disclosed. In a first step, the flex foil 80 is laminated to a base plate 82 such that the circuit traces 81 are located opposite the base plate 82. A flex foil flap 84 which was previously cut into the flex foil 80 is aligned with an opening 86 in the base plate 82.

In a second step, the flex foil laminated base plate 82 is located upon a fixture 88. It should be understood that only a single sensor is disclosed in the disclosed embodiment, a plurality of sensors are preferably mounted simultaneously in a fixture which retains a multiple of base plates. The fixture 88 includes an extension 90 located substantially perpendicular to the fixture 88 which receives the base plate 82. The extension 90 is aligned with the opening 86 and folds the flap 84 such that flap 84 is pushed substantially perpendicular to the opening 86.

In a third step, the sensor 92 is mounted to the base plate 82 by the desired attachment members such as snaps, threaded fasteners, pins or the like. Notably, the contacts 94 which extend from the sensor 92, clear the folded flap 84 and are received within a recess 96 in the fixture 88.

In a fourth step, the base plate 82 and mounted sensor 92 are removed from the fixture 88. As the base plate 82 is removed from the fixture 88, the extension 90 lets the flap 84 unfold such that circuit traces 81 of the flex foil 80 are now adjacent the contacts 94.

In a final step, the circuit traces 81 are electrically connected to the contacts 94 by laser welding or the like. It should be understood that the welding or other attachment operation may be performed on this or another welding dedicated fixture.

Referring to FIG. 9, another a method for mounting the sensor as disclosed in FIGS. 6A–B is disclosed. The FIG. 9 method includes essentially the same steps as the FIG. 7 embodiment, however, a movable extension 90' is provided. The fixture 88' receives the laminated base plate 82 and the extension 90' folds the flap 84 substantially perpendicular to the opening 86.

The sensor is mounted to the base plate and then the extension 90' is retracted. The flap 84 unfolds and the circuit traces 81 of the flex foil 80 are adjacent the contacts 94. The circuit traces 81 are then electrically connected to the contacts 94 by laser welding or the like.

It should be understood that although sensors and connectors are disclosed in the illustrated embodiment, other components will also benefit from the instant invention.

The foregoing description is exemplary rather than defined by the limitations within. Many modifications and variations of the present invention are possible in light of the above teachings. The preferred embodiments of this invention have been disclosed, however, one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. A method of mounting an electrical component comprising the steps of:
   (1) attaching a flex foil to a base plate such that a flex foil flap comprising a circuit trace adjacent to a base plate opening in said base plate;
   (2) deflecting the flex foil flap in a first direction substantially perpendicular to said base plate;
   (3) passing an electrical contact of the electrical component into the opening in a second direction different than the first direction;
   (4) releasing said flex foil flap; and
   (5) electrically connecting said comprising a circuit trace upon said flex foil flap to said electrical contact.

2. The method as recited in claim 1, wherein said step (1) includes bonding the flex foil to the base plate.

3. The method as recited in claim 1, wherein said step (3) includes mounting a component having the electrical contact to the base plate.

4. The method as recited in claim 3, wherein said step (3) includes riveting the component to the base plate.

5. The method as recited in claim 3, wherein said step (3) includes snapping the component to the base plate.

6. The method as recited in claim 3, wherein said step (3) includes mounting the component to the base plate on a side of the base plate opposite the flex foil.

7. The method as recited in claim 1, wherein said step (2) includes folding the flex foil flap opposite a direction from which the electrical component is mounted.

8. The method as recited in claim 1, wherein said step (1) includes locating the flex foil flap in a cantilever manner over the base plate opening.

9. The method as recited in claim 1, wherein said step (1) includes locating the flex foil flap in a cantilever manner over an edge of the base plate opening.

10. The method as recited in claim 1, wherein said step (1) includes facing the circuit trace flex foil flap toward the base plate.

11. The method as recited in claim 1, wherein said step (1) includes facing the circuit trace flex foil flap away from the base plate.

* * * * *